(12) United States Patent  
Kovatchev et al.

(10) Patent No.: US 8,964,392 B2
(45) Date of Patent: Feb. 24, 2015

(54) DEVICE FOR SCREENING AN ELECTRONIC MODULE

(75) Inventors: Emil Kovatchev, Vienna (AT); Michael Maryschka, Vienna (AT)

(73) Assignee: Continental Automotive GmbH, Hanover (DE)

( * ) Notice: Subject to any disclaimer, the term of this patent is extended or adjusted under 35 U.S.C. 154(b) by 249 days.

(21) Appl. No.: 13/580,140

(22) PCT Filed: Feb. 17, 2011

(86) PCT No.: PCT/EP2011/052371
§ 371 (c)(1),
(2), (4) Date: Nov. 5, 2012

(87) PCT Pub. No.: WO2011/107348
PCT Pub. Date: Sep. 9, 2011

(65) Prior Publication Data
US 2013/0044436 A1 Feb. 21, 2013

(30) Foreign Application Priority Data

Feb. 19, 2010 (DE) .......................... 10 2010 008 553

(51) Int. Cl.
*H05K 7/20* (2006.01)
*H05K 1/02* (2006.01)
(52) U.S. Cl.
CPC ............ *H05K 1/0218* (2013.01); *H05K 1/0203* (2013.01); *H05K 2201/1056* (2013.01)
USPC ........... 361/712; 361/720; 361/761; 361/818; 174/51; 174/262; 174/548
(58) Field of Classification Search
USPC ........................ 361/676–678, 679.46–679.54, 361/688–722, 752, 760–761, 772–800, 816, 361/831
See application file for complete search history.

(56) References Cited

U.S. PATENT DOCUMENTS

| 6,181,571 | B1 | 1/2001 | Sugimoto ..................... 361/799 |
| 6,198,362 | B1 | 3/2001 | Harada et al. ................... 333/12 |
| 6,219,236 | B1 | 4/2001 | Hirano et al. ................. 361/695 |
| 6,636,429 | B2 * | 10/2003 | Maly et al. ..................... 361/818 |
| 2004/0095730 | A1 | 5/2004 | Youm et al. .................... 361/718 |
| 2005/0213309 | A1 | 9/2005 | Hiratsuka et al. ............. 361/816 |
| 2006/0064998 | A1 * | 3/2006 | Funahashi et al. ............ 62/228.4 |
| 2009/0040731 | A1 | 2/2009 | Jin et al. ........................ 361/711 |
| 2009/0212391 | A1 * | 8/2009 | Carobolante et al. ......... 257/531 |

(Continued)

FOREIGN PATENT DOCUMENTS

| DE | 4317469 A1 | 12/1994 | .............. H05K 9/00 |
| DE | 19519776 A1 | 2/1997 | .............. H05K 3/34 |

(Continued)

OTHER PUBLICATIONS

International Search Report and Written Opinion, Application No. PCT/EP2011/052371, 18 pages, Jun. 27, 2011.

*Primary Examiner* — Courtney Smith
(74) *Attorney, Agent, or Firm* — King & Spalding L.L.P.

(57) ABSTRACT

A device for screening an electronic module which has electronic components fixed to a printed circuit board and which is connected to a heat sink. The heat sink comprises an electrically conductive material. The printed circuit board has at least one layer composed of electrically conductive material. The heat sink and the printed circuit board serve as screening elements.

21 Claims, 1 Drawing Sheet

(56) References Cited

U.S. PATENT DOCUMENTS

2009/0284913 A1* 11/2009 Wakabayashi et al. .. 361/679.54
2011/0299265 A1* 12/2011 Nakatsu et al. ............... 361/820
2013/0044436 A1   2/2013 Kovatchev et al. ........... 361/720

FOREIGN PATENT DOCUMENTS

| DE | 19911731 C2 | 8/2002 | ............... H05K 1/02 |
| EP | 0340959 A2 | 11/1989 | ............... H01L 23/00 |
| WO | 2011/107348 A1 | 9/2011 | ............... H05K 1/02 |

* cited by examiner

DEVICE FOR SCREENING AN ELECTRONIC MODULE

CROSS-REFERENCE TO RELATED APPLICATIONS

This application is a U.S. National Stage Application of International Application No. PCT/EP2011/052371 filed Feb. 17, 2011, which designates the United States of America, and claims priority to German Application No. 10 2010 008 553.7 filed Feb. 19, 2010, the contents of which are hereby incorporated by reference in their entirety.

TECHNICAL FIELD

This disclosure relates to a device for shielding an electronic module.

BACKGROUND

It is known that electronic modules, for example electronic modules having a DC-DC converter, generate waste heat as a result of electrical losses and, for this reason, are connected to one or more heat sinks in order to dissipate the waste heat formed.

Furthermore, it is already known practice to provide electronic devices either in an open configuration or to install said devices in a housing. Such electronic devices tend to have a problematic EMC behavior, that is to say increased radio-frequency emissions.

If the electronic device contains a DC-DC converter, the steep rising and falling edges produced therein of the currents and voltages flowing through the parts of the DC-DC converter cause radio-frequency electromagnetic fields. As a result of the open configuration or else as a result of housing walls made of dielectric materials, said fields pass to the area surrounding the electronic device, which corresponds to the presence of undesirable emissions.

There are already industrial standards which define limit values for such emissions as well as relevant measuring methods. These standards include, for example, DIN EN 55022 for industry and IEC CISPR 25 for the automotive sector.

Complying with these standards, in particular in the automotive sector, is generally a demanding challenge which is generally associated with considerable time and costs for the respective manufacturer.

In this connection, it is already known practice to arrange an electronic module which generates radio-frequency electromagnetic fields in a housing made of electrically conductive material, the components of which are electrically connected to one another. As a result, a large part of the interference fields generated by the electronic module inside the housing is intercepted by the walls of the housing and is possibly discharged to ground. This is effected in most cases using an AC path which is provided for this purpose and, starting from the electronics, extends, through the air, to the housing and from the latter, via capacitors or via a direct electrical connection, to printed circuit board ground and from there, via a cable harness, into the negative pole of the automobile battery or the vehicle electrical system of a motor vehicle.

In practice, this is often achieved by means of a pre-punched component which is arranged above the emitting components and is made of electrically conductive material. This component can be fastened by means of soldering or by means of a pressing-in operation. When establishing the mechanical connection, care is taken to ensure that the best possible electrical connection to a defined potential, usually ground, is also produced. This electrical connection then forms a path for the currents which induce the interference fields in the component in the form of a shield.

Alternatively, it is possible to use a two-part housing having a lower part and an upper part, the upper part being able to be a sheet metal lid. In the case of such an implementation, a printed circuit board, for example, on which the emitting electronic components are provided is connected to the lower part by means of screws. These screws provide mechanical support and ensure an electrical connection between printed circuit board ground and the housing. The upper part is typically screwed on or is mechanically fastened to claws, tongues or springs with the aid of a spring construction or by means of latching apparatuses and is also electrically connected to the lower part. This produces a construction which is more or less closed in terms of EMC and, with a correct design, approximates a Faraday cage.

SUMMARY

In one embodiment, a device is provided for shielding an electronic module which has electronic components, which are fastened to a printed circuit board and emit electromagnetic radiation, and is connected to a heat sink, wherein the heat sink comprises an electrically conductive material, the printed circuit board has at least one layer made of an electrically conductive material, and the heat sink and the printed circuit board are used as shielding elements.

In a further embodiment, the printed circuit board has a copper layer. In a further embodiment, the printed circuit board has a plurality of copper layers. In a further embodiment, the electronic components of the electronic module are fastened to the underside of the printed circuit board. In a further embodiment, the electronic components are parts of a DC-DC converter. In a further embodiment, the heat sink is connected to the electrically conductive layer of the printed circuit board by means of one or more current-conducting connecting elements. In a further embodiment, the connecting elements are screws made of an electrically conductive material. In a further embodiment, the screws are each guided through a receiving opening of the printed circuit board, which opening is surrounded by an electrically conductive, annular area. In a further embodiment, the electrically conductive, annular areas are each connected to ground via a capacitor. In a further embodiment, the heat sink has, on its top side, a frame which is in the form of a collar and into which the printed circuit board is inserted. In a further embodiment, the printed circuit board is mechanically fastened to the heat sink by means of the connecting elements. In a further embodiment, the surface of the heat sink is provided with a thermally conductive material or a thermally conductive film.

BRIEF DESCRIPTION OF THE DRAWINGS

Example embodiments will be explained in more detail below with reference to figures, in which.

DETAILED DESCRIPTION

Some embodiments provide a device which does not need a complete housing or a pre-punched component in the form of a shield in order to shield an electronic module.

In some embodiments, a device as disclosed herein can be dismantled and is thus easy to maintain. In contrast to this, a conventional shielding part is generally soldered on or pressed in and, for this reason, can no longer be removed without destroying the device in order to make it possible to access the components arranged below the shield.

Furthermore, in some embodiments that can at least partially be reused after dismantling, for example when a thermally conductive film is used and when screws are used as connecting elements.

Furthermore, production and logistical problems associated with acquiring shielding parts and fitting the latter in accordance with the rules are dispensed with when producing a device as disclosed herein.

Further, in some embodiments the device allows the printed circuit board fitted with the electronic module to be visually inspected using a camera during production. Such visual inspection is either impossible or possible only with difficulty when a shielding part is fastened above the electronic module. This is because, in this case, the components themselves and their soldering points would no longer be optically visible and consequently could not be inspected using a camera.

Furthermore, costs may be saved as a result of the omission of a component in the form of a shield in the case of partial shielding and as a result of the omission of a sheet metal lid in the case of shielding using a two-part housing.

Figure 1:
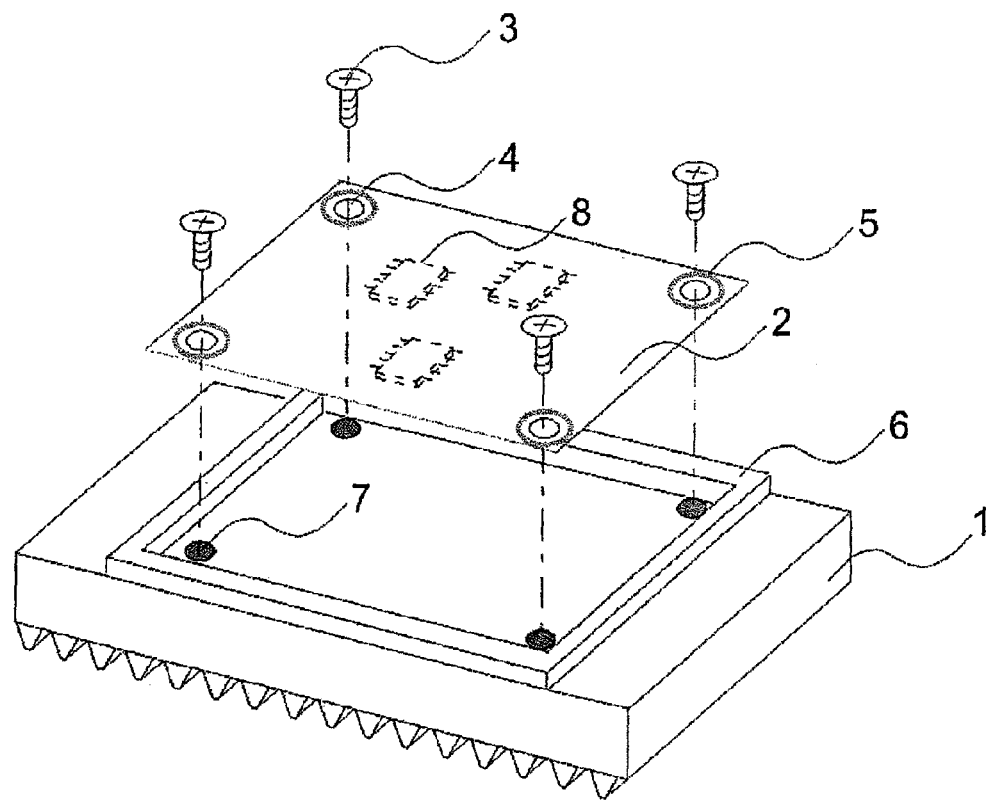
FIG. 1 shows a perspective sketch of a device for shielding an electronic module.

FIG. 1 shows a perspective sketch of a device for shielding an electronic module. The illustrated device has a heat sink 1 which comprises an electrically conductive material and contains, on its top side, a frame 6 which is in the form of a collar, is part of the heat sink 1 and comprises an electrically conductive material. A total of four receiving openings 7 are provided in the surface of the heat sink 1 inside the frame 6 and are intended to receive fastening elements 3. These fastening elements 3 are electrically conductive screws comprising metal.

These screws are used to permanently connect a printed circuit board 2 inside the frame 6 to the heat sink 1. This printed circuit board 2 has a total of four continuous receiving openings 4 through which the screws 3 for fastening the printed circuit board 2 on the heat sink 1 are guided. The immediate area surrounding the continuous receiving openings 4 of the printed circuit board 2 is formed by annular, electrically conductive areas 5.

A plurality of electronic components are fastened to the underside of the printed circuit board 2 and form an electronic module 8 which is a DC-DC converter, for example. Its components cause radio-frequency electromagnetic fields during operation of the device, which fields would extend to the outside without shielding measures.

Figure 2:
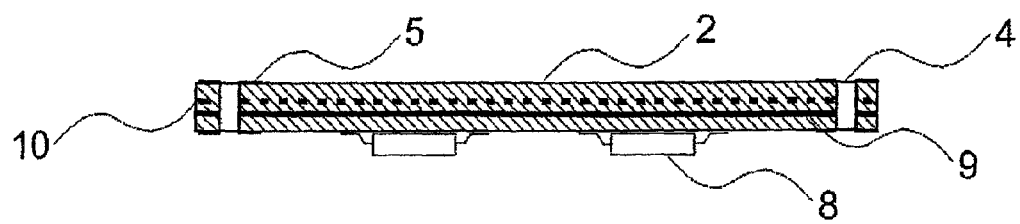
FIG. 2 shows a sectional illustration of the printed circuit board 2 from FIG. 1.

An example of a structure of the printed circuit board 2 is illustrated in FIG. 2 which shows a cross-sectional illustration of the printed circuit board. The components of the electronic module 8 are fastened to the underside of a lower layer of this printed circuit board 2, for example using soldered connections.

A layer 9 arranged above this lower layer of the printed circuit board 2 comprises an electrically conductive material, for example copper. This copper layer 9 is in the form of an extensive ground layer at least in the region above the electronic module. Like the heat sink 1 comprising electrically conductive material, the copper layer 9 is used as a shielding element.

Above the copper layer 9, the printed circuit board 2 has either a covering layer or—as illustrated in FIG. 2—a middle layer and a further layer 10 which is provided above the latter and comprises a conductive material, e.g., a further copper layer, as an extensive ground layer. The covering layer of the printed circuit board 2 is above this further copper layer 10. Furthermore, two continuous receiving openings 4 of the printed circuit board 2 and two conductive areas 5 of the printed circuit board 2 can also be seen in FIG. 2.

An electrical connection between the copper layer(s) and the heat sink is ensured by the screws 3, which are shown in FIG. 1, are guided through the receiving openings 4 of the printed circuit board and are screwed into the receiving openings 7 of the heat sink 1, and the conductive areas 5. This electrical connection provides a DC voltage path. Alternatively, however, this electrical connection may also be realized in the form of an AC path since the interference currents flowing are usually radio-frequency currents. In this case, the annular conductive areas 5 are connected to a printed circuit board ground layer via capacitors.

The dimensions of the frame 6 arranged on the surface of the heat sink 1 are selected in such a manner that the printed circuit board 2 can be inserted into the frame 6 in such a manner that the side walls of the frame 6 surround the outer edge of the printed circuit board 2. This prevents the electronic module 8 fastened to the underside of the printed circuit board from emitting electromagnetic radiation in the lateral direction.

According to one embodiment, the surface of the heat sink 1 is wetted with a thermally conductive material or is provided with a thermally conductive film when assembling the device before the printed circuit board 2 is mounted. The printed circuit board 2 is then fastened to the heat sink by means of the connecting elements 3. As a result of the press-in pressure produced during this mounting and as a result of the use of a thermally conductive material or a thermally conductive film, a thermal connection, that is to say a heat bridge, is produced between the lower layer of the printed circuit board 2, the surface of the components of the electronic module 8 fastened to the underside of the printed circuit board and the surface of the heat sink 1, which thermal connection improves dissipation of the heat produced by the components of the electronic module 8.

The heat sink 1 comprises an aluminum alloy, for example. The printed circuit board 2 has a multi-layer design, e.g., a two-layer or four-layer design. As stated above, the electronic module may be a DC-DC converter. Alternatively, the electronic module may also be a module provided for another purpose.

In the light of the foregoing, some embodiments provide a device for shielding an electronic module which has electronic components fastened to the underside of a printed circuit board and is connected to a heat sink, the heat sink comprising an electrically conductive material, the printed circuit board having at least one layer made of an electrically conductive material, and the heat sink and the printed circuit board being used as shielding elements.

What is claimed is:

1. A device for shielding an electronic module which has electronic components, which are fastened to a printed circuit board and emit electromagnetic radiation, and which is connected to a heat sink,
    wherein the heat sink comprises an electrically conductive material,
    wherein the printed circuit board is arranged over a top side of the heat sink and comprises at least one grounding layer made of an electrically conductive material, the at least one conductive grounding layer being sandwiched between upper and lower layers of the printed circuit boards, wherein the electronic components are physically mounted to a bottom side of the printed circuit board and in thermal contact with the top side of the heat sink such that the electronic components are arranged between the heat sink and the printed circuit board, such that the electrically conductive heat sink and the at least one conductive grounding layer formed within the printed circuit board cooperate to shield the electromagnetic radiation emitted from the electronic components mounted to the bottom side of the printed circuit board.

2. The device of claim 1, wherein the printed circuit board comprises exactly one grounding layer, the grounding layer comprising a copper layer.

3. The device of claim 2, wherein the printed circuit board comprises a plurality of grounding layers, each comprising a copper layer.

4. The device of claim 1, wherein the electronic components of the electronic module are fastened to an underside of the printed circuit board.

5. The device of claim 1, wherein the electronic components are components of a DC-DC converter.

6. The device of claim 4, wherein the heat sink is connected to the electrically conductive layer of the printed circuit board by one or more current-conducting connecting elements.

7. The device of claim 6, wherein the conductive connecting elements comprise screws formed from an electrically conductive material.

8. The device of claim 7, wherein each screw is guided through a receiving opening of the printed circuit board surrounded by an electrically conductive, annular area on the printed circuit board.

9. The device of claim 8, wherein each electrically conductive, annular area is connected to ground directly or via a capacitor.

10. The device of claim 1, wherein the heat sink comprises a frame on a top side of the heat sink, the frame comprising a collar shaped to extend around a perimeter edge of the printed circuit board.

11. The device of claim 1, wherein a thermally conductive material or a thermally conductive film is arranged on a surface of the heat sink.

12. An electronic device, comprising:
a heat sink formed from an electrically conductive material,
a printed circuit board is arranged over a top side of the heat sink and comprising at least one grounding layer made of an electrically conductive material, the at least one conductive grounding layer being sandwiched between upper and lower layers of the printed circuit board,
an electronic module comprising electronic components physically mounted to a bottom side of the printed circuit board and in thermal contact with the top side of the heat sink,
such that the electrically conductive heat sink and the at least one conductive grounding layer formed within the printed circuit board cooperate to shield the electromagnetic radiation emitted from the electronic components mounted to the bottom side of the printed circuit board.

13. The electronic device of claim 12, wherein the printed circuit board comprises exactly one grounding layer, the grounding layer comprising a copper layer.

14. The electronic device of claim 13, wherein the printed circuit board comprises a plurality of grounding layers, each comprising a copper layer.

15. Tice electronic device of claim 12, wherein the electronic components of the electronic module are coupled to an underside of the printed circuit board.

16. The electronic device of claim 12, wherein the heat sink is coupled to the electrically conductive layer of the printed circuit board by one or more current-conducting connecting elements.

17. The electronic device of claim 16, wherein each screw is guided through a receiving opening of the printed circuit board is surrounded by an electrically conductive, annular area on the printed circuit board.

18. The electronic device of claim 17, wherein each electrically conductive, annular area is connected to ground directly or via a capacitor.

19. The electronic device of claim 12, wherein the heat sink comprises a frame on a top side of the heat sink, the frame comprising a collar shaped to extend around a perimeter edge of the printed circuit board.

20. The device of claim 1, further comprising:
a plurality of receiving openings formed in the printed circuit board at laterally spaced-apart locations, and
a plurality of conductive connecting elements extending through the plurality of receiving openings and securing the printed circuit board to the heat sink,
wherein each conductive grounding layer extends laterally across the printed circuit board to define a conductive path between the plurality of laterally spaced-apart conductive connecting elements via the conductive grounding layer.

21. The electronic device of claim 12, further comprising;
a plurality of receiving openings formed in the printed circuit board at laterally spaced-apart locations, and
a plurality of conductive connecting elements extending through the plurality of receiving openings and securing the printed circuit board to the heat sink,
wherein each conductive grounding layer extends laterally across the printed circuit board to define a conductive path between the plurality of laterally spaced-apart conductive connecting elements via the conductive grounding layer.

* * * * *